US006616796B1

(12) United States Patent
Onodera et al.

(10) Patent No.: US 6,616,796 B1
(45) Date of Patent: Sep. 9, 2003

(54) METAL LAMINATE FOR A CIRCUIT BOARD

(75) Inventors: Minoru Onodera, Kurashiki (JP);
Tadao Yoshikawa, Kurashiki (JP);
Takeichi Tsudaka, Kurashiki (JP);
Toshiaki Sato, Kurashiki (JP)

(73) Assignee: Kuraray Co., Ltd., Kurashiki (JP)

( * ) Notice: Subject to any disclaimer, the term of this patent is extended or adjusted under 35 U.S.C. 154(b) by 0 days.

(21) Appl. No.: 09/534,997

(22) Filed: Mar. 27, 2000

(30) Foreign Application Priority Data

Mar. 29, 1999 (JP) .......................... 11-086023
Jan. 19, 2000 (JP) ...................... 2000-010635

(51) Int. Cl.[7] .............................. B32B 31/20
(52) U.S. Cl. ............ 156/309.6; 156/164; 428/1.2; 428/1.62; 174/259
(58) Field of Search ................. 428/1.5, 1.62, 428/1.2; 156/164, 309.6; 174/259

(56) References Cited

U.S. PATENT DOCUMENTS

| 4,863,767 | A | * | 9/1989 | Garg et al. | ............... 156/308.2 |
| 4,966,807 | A |   | 10/1990 | Harvey et al. | |
| 5,164,141 | A | * | 11/1992 | Becker et al. | ............ 156/309.6 |
| 6,124,004 | A | * | 9/2000 | Furuta et al. | ............... 428/1.62 |
| 6,272,242 | B1 | * | 8/2001 | Saitoh et al. | ................ 382/187 |
| 6,334,922 | B1 | * | 1/2002 | Tanaka et al. | ............... 156/234 |

FOREIGN PATENT DOCUMENTS

| EP | 0 507 332 | 10/1992 |   |
| EP | 0 697 278 | 2/1996 |   |
| EP | 0 949 067 | 10/1999 |   |
| GB | 846369 | * 8/1960 | .................. 156/164 |
| JP | 5-042603 | 2/1993 |   |

OTHER PUBLICATIONS

U.S. patent application Ser. No. 09/283,871, filed Apr. 1, 1999, now US 6,274,242.
U.S. patent application Ser. No. 09/283,867, filed Apr. 1, 1999, now US 6,334,922.
U.S. patent application Ser. No. 09/534,997, filed Mar. 27, 2000, pending.

* cited by examiner

Primary Examiner—Michael W. Ball
Assistant Examiner—John Goff
(74) Attorney, Agent, or Firm—Oblon, Spivak, McClelland, Maier & Neustadt, P.C.

(57) ABSTRACT

A method of producing a metal laminate for a circuit board includes a first step of press-bonding a thermotropic liquid crystal polymer film 1 having a segment orientation ratio SOR within a range not smaller than 0.90 and smaller than 1.15 along the longitudinal direction of the film, to a metal sheet 3 between hot rolls while the thermotropic liquid crystal polymer film 1 is in a tense or non-tense state; and a second step of heating the laminate obtained in the first step to a temperature not lower than the melting point of the thermotropic liquid crystal polymer film.

18 Claims, 1 Drawing Sheet

METAL LAMINATE FOR A CIRCUIT BOARD

BACKGROUND OF THE INVENTION

1. Field of the Invention

The present invention relates to a metal laminate for a circuit board, having a film (which film is hereinafter referred to as a thermotropic liquid crystal polymer film) made of a thermotropic polymer capable of forming an optically anisotropic melt phase (which thermotropic polymer is hereinafter referred to as a thermotropic liquid crystal polymer), and a method for producing the same. More particularly, the metal laminate for a circuit board according to the present invention has not only an excellent low moisture absorbability, heat resistance, chemical resistance, and electric properties deriving from the thermotropic liquid crystal polymer film but also an excellent dimensional stability, so that it is useful as a material for a circuit board such as a flexible wiring board or a circuit board for mounting a semiconductor.

2. Description of the Prior Art

In recent years, the demands for scale reduction and weight reduction in portable electronic devices for mobile communication and others are becoming high, and an expectation for high density mounting is becoming increasingly strong. In accordance therewith, multi-layered wiring boards, reduced wiring pitches, fine via holes, and small-size multiple-pin IC packages are being developed, and also the scale reduction and surface mounting of passive elements such as capacitors and resistors are taking place along with this. Especially, the technique of forming these passive components directly on a surface or in an inside of a printed wiring board or the like can not only achieve high density mounting but also contributes to an improvement in reliability. In accordance therewith, the level of demands for the dimensional stability of the wiring boards. i.e. small variation in the dimension after the formation of a conductor circuit, are becoming high, and further there is a demand for eliminating its anisotropy.

In the meantime, thermotropic liquid crystal polymer films having an excellent low moisture absorbability, heat resistance, chemical resistance, and electric properties are rapidly commercialized as an electrically insulating material that improves the reliability of printed wiring boards and others.

Conventionally, in producing a metal laminate for use in a circuit board such as a printed wiring board using a thermotropic liquid crystal polymer film, a thermotropic liquid crystal polymer film cut to a predetermined size and a metal foil are placed in superposition between two hot platens with the use of a vacuum hot press device, and thermally press-bonded in a vacuum state (batch type vacuum hot press lamination). At this time, if the segment orientation ratio SOR of the thermotropic liquid crystal polymer film before press-bonding is approximately 1, then a metal laminate having a good dimensional stability is obtained. However, since the vacuum hot press lamination is a sheet-type production method, the period of time for superposing the materials, the period of time for one pressing operation, the period of time for taking out the material after pressing, and the like will be long, thereby slowing the production speed per one sheet of the metal laminate and leading to increased costs. Moreover, if the equipments are improved so that a large number of sheets can be produced at the same time for increasing the production speed, then the equipments will be large in scale, disadvantageously leading to high equipment costs. Accordingly, there is a demand for solving this problem and developing a continuous production method capable of providing metal laminates at a low cost.

Thus, there is proposed (a) a method of superposing a long thermotropic liquid crystal polymer film on a metal foil and allowing them to pass between hot rolls for press-bonding in such a manner that the press-bonding temperature is within the range from a temperature lower by 80° C. than the melting point of the thermotropic liquid crystal polymer film to a temperature lower by 5° C. than the melting point for performing continuous production of the metal laminates (Japanese Laid-open Patent Publication No. 05-42603/1993). Further, there is proposed a method of thermally treating a thermotropic liquid crystal polymer film at a predetermined temperature (Japanese Laid-open Patent Publication No. 08-90570/1996).

However, according to the methods of (a) and (b), it is difficult to continuously and stably obtain a metal laminate having a good isotropy and good dimensional stability. In other words, in the case where a thermotropic liquid crystal polymer film is press-bonded to a metal foil between hot rolls, the temperature conditions are described as shown above, but the tension imposed on the film in press-bonding is not considered at all. If this tension is applied, the movement of the molecules in the thermotropic liquid crystal polymer film is likely to occur. As a result, in accordance with heating, the change in the molecule orientation is likely to take place on the surface of the film in a metal laminate using the film. For these reasons, it has been difficult to obtain a metal laminate having a good isotropy and good dimensional stability.

Further, in the method of (a), although the conditions for improving the adhesion strength to the metal sheet and the improvement in the mechanical strength are described, the improvement in the dimensional stability is not described. In the method of (b), although the heated dimensional changing ratio of the thermotropic liquid crystal polymer film is described, the properties of the metal laminate using the thermotropic liquid crystal polymer film are not described. Therefore, in the conventional methods, continuous production of metal laminates for circuit boards having a good isotropy and a good dimensional stability has not been realized.

Accordingly, the object of the present invention is to provide a metal laminate for a circuit board and a method for producing the same by which the metal laminate for a circuit board having an excellent isotropy and an excellent dimensional stability can be produced continuously at a high productivity by using hot rolls and a heating equipment.

SUMMARY OF THE INVENTION

In order to achieve the aforesaid object, the inventors of the present invention have made studies and found a method that can continuously and stably produce metal laminates for a circuit board having an excellent isotropy and an excellent dimensional stability. The methods comprises the steps of: using a thermotropic liquid crystal polymer film whose segment orientation ratio SOR is within a specific range and; after the thermotropic liquid crystal polymer film and a metal sheet such as represented by a metal foil and a metal plate are press-bonded together between hot rolls under a specific tension condition depending on the segment orientation ratio SOR, heating the obtained laminate under a specific temperature condition. According to this method, the isotropy of a thermotropic liquid crystal polymer film in a laminated state can be obtained thereby obtaining a metal laminate for a circuit board being excellent in isotropy and dimensional stability.

The production method according to the first invention comprises a first step of using a thermotropic liquid crystal polymer film having a segment orientation ratio SOR within a range not smaller than 1.03 and smaller than 1.15 along a longitudinal direction of the film, and press-bonding a metal sheet on at least one surface of the thermotropic liquid crystal polymer film between hot rolls while said thermotropic liquid crystal polymer film is in a tense state; and a second step of heating the laminate obtained in the first step to a temperature not lower than a melting point of the thermotropic liquid crystal polymer film.

Here, the term "segment orientation ratio (SOR)" used hereinbefore and hereinafter is an index descriptive of the degree of orientation of molecules forming a segment and represents, unlike the standard MOR (molecular orientation ratio), a value in which the thickness of an object is taken into consideration. Further, the tense state refers to the state in which a tension (for example, 1.2 to 2.8 kg/mm$^2$) is applied onto a film along the longitudinal direction of the film (tensile direction).

According to the knowledge of the present inventors, the thermotropic liquid crystal polymer film, when heated in a freely expandable and contractible state, contracts in the oriented direction of the molecules, and expands in the non-oriented direction, and also has a property such that the orientation direction changes easily in accordance with the force acting on the molecules.

According to the first invention, if the thermotropic liquid crystal polymer film has a segment orientation ratio SOR not smaller than 1.03 and smaller than 1.15 to be oriented in a longitudinal direction of the film, the film tends to contract in the longitudinal direction due to the above-mentioned property, and this contracting force brings the film into a tense state. However, by applying a tension to the film, the contracting force of the film is canceled, so that the orientation of the film in the longitudinal direction does not change. On the other hand, since an expanding force is applied to the film in a direction perpendicular to the longitudinal direction of the film, the orientation of the film changes in the direction perpendicular to the longitudinal direction due to the property such that the orientation direction is easily changed by the force acting on the molecules in the thermotropic liquid crystal polymer film. As a result of this, the film in a laminated state will be isotropic due to canceled anisotropy. By successively heating the obtained laminate to a temperature not lower than the melting point of the thermotropic liquid crystal polymer film, a metal laminate having an isotropic property and a desired dimensional changing ratio and being excellent in dimensional stability can be obtained continuously in a stable manner.

Further, the production method according to the second invention comprises a first step of using a thermotropic liquid crystal polymer film having a segment orientation ratio SOR within a range not smaller than 0.90 and smaller than 1.03 along a longitudinal direction of the film, and press-bonding a metal sheet on at least one surface of the thermotropic liquid crystal polymer film between hot rolls while said thermotropic liquid crystal polymer film is in a non-tense state; and a second step of heating the laminate obtained in the first step to a temperature not lower than a melting point of the thermotropic liquid crystal polymer film.

Here, the non-tense state refers to a state in which a tension higher than the gravitational force applied to the film by self weight is not applied to the film.

According to the second invention, if the thermotropic liquid crystal polymer film has a segment orientation ratio SOR not smaller than 0.90 and smaller than 1.03 to be generally oriented in a direction perpendicular to a longitudinal direction of the film, the film tends to contract in the direction perpendicular to the longitudinal direction, along which the molecules are oriented, and tends to expand in the longitudinal direction of the film, along which the molecules are not oriented, due to the above-mentioned property. In this case, by bringing the film into a non-tense state contrary to the first invention, i.e. by not applying a tension higher than the self weight to the film, the orientation direction changes to the longitudinal direction of the film. As a result of this, the film in a laminated state maintains the isotropy or becomes isotropic by cancellation of the anisotropy. By successively heating the obtained laminate to a temperature not lower than the melting point of the thermotropic liquid crystal polymer film, a metal laminate being excellent in isotropy and dimensional stability can be obtained in a stable manner.

Thus, the first and second inventions make it possible to continuously produce a metal laminate for a circuit board being excellent in isotropy and dimensional stability, thereby increasing the productivity and reducing the production costs.

The raw materials of the thermotropic liquid crystal polymer film to be used in the present invention are not specifically limited. Nonetheless, specific examples thereof include, for example, well known thermotropic liquid crystal polyesters and thermotropic liquid crystal polyester amides prepared from compounds, such as classified under (1) to (4) below, and their derivatives. It is, however, pointed out that to prepare a polymer capable of forming an optically anisotropic melt phase, various raw material compounds have their proper combination and amount carefully chosen.

(1) Aromatic or aliphatic dihydroxy compounds, representative examples of which are shown in Table 1 below.

TABLE 1

Chemical formulas of the representative examples of aromatic or aliphatic dihydroxy compounds

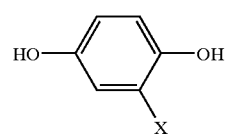

(X: hydrogen atom or halogen atom, or lower alkyl, phenyl or like groups),

TABLE 1-continued

Chemical formulas of the representative examples of aromatic or aliphatic dihydroxy compounds

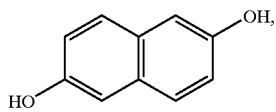 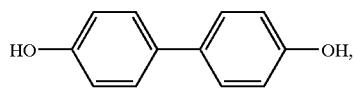

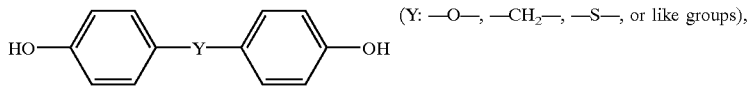

(Y: —O—, —CH$_2$—, —S—, or like groups),

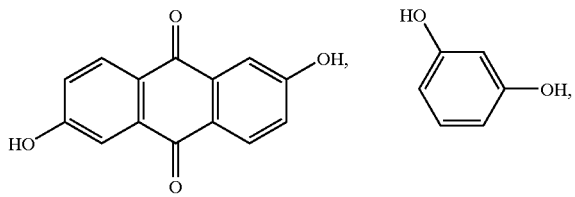 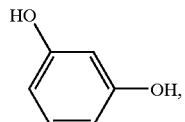

HO(CH$_2$)nOH                          (n: an integer from 2 to 12)

(2) Aromatic or aliphatic dicarboxylic acids, representative examples of which are shown in Table 2 below.

TABLE 2

Chemical formulas of the representative examples of aromatic or aliphatic dicarboxylic acids

 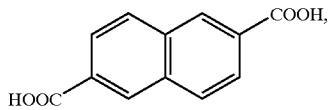

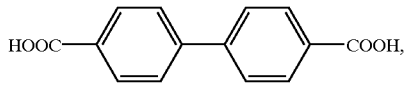 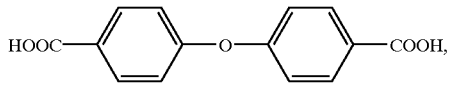

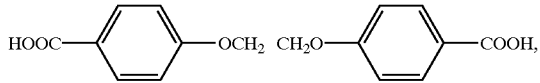 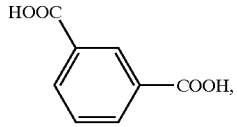

HOOC(CH$_2$)nCOOH                    (n: an integer from 2 to 12)

(3) Aromatic hydroxycarboxylic acids, representative examples of which are shown in Table 3 below.

TABLE 3

Chemical formulas of the representative examples of aromatic hydroxycarboxylic acids

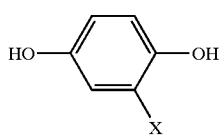

(X: hydrogen atom or halogen atom, or lower alkyl, phenyl or like groups),

TABLE 3-continued

Chemical formulas of the representative
examples of aromatic hydroxycarboxylic acids

[Structures: 6-hydroxy-2-naphthoic acid; 4'-hydroxy-4-biphenylcarboxylic acid; 3-hydroxybenzoic acid]

(4) Aromatic diamines, aromatic hydroxyamines, and aromatic aminocarboxylic acids, representative examples of which are shown in Table 4 below.

TABLE 4

Chemical formulas of the representative examples of aromatic diamines,
aromatic hydroxyamines, and aromatic aminocarboxylic acids

[Structures: $H_2N$—C$_6$H$_4$—$NH_2$, $H_2N$—C$_6$H$_4$—OH, $H_2N$—C$_6$H$_4$—COOH]

Representative examples of the thermotropic liquid crystal polymers prepared from any of those raw material compounds include copolymers (a) to (e) having such structural units as shown in Table 5 below.

TABLE 5

Representative examples of thermotropic liquid crystal polymers (a) —[OC—C$_6$H$_4$—CO]— —[OCH$_2$CH$_2$O]— —[OC—C$_6$H$_4$—O]— copolymer (b) —[O—C$_6$H$_4$—CO]— [naphthalene unit] copolymer (c) —[O—C$_6$H$_4$—CO]— —[OC—C$_6$H$_4$—CO]— —[OC—C$_6$H$_4$(m)—CO]—
—[O—C$_6$H$_4$—C$_6$H$_4$—O]— copolymer (d) [naphthalene unit] —[OC—C$_6$H$_4$—CO]— —[O—C$_6$H$_4$—NH]— copolymer (e) —[O—C$_6$H$_4$—CO]— —[OC—C$_6$H$_4$—CO]— —[O—C$_6$H$_4$—O]—
—[O—C$_6$H$_4$—X—C$_6$H$_4$—O]— copolymer (X: —O—, —CH$_2$—, —S—, or like groups)

Further, in order to impart a desired heat resistance and processability to the film, the thermotropic liquid crystal polymer to be used in the present invention has a melting point preferably within the range from about 200 to about 400° C., more preferably within the range from about 250 to about 350° C. However, in view of the film production, the thermotropic liquid crystal polymer preferably has a comparatively low melting point. Therefore, if a higher heat resistance or a melting point is needed, the obtained film can be further heated to raise the heat resistance and the melting point of the thermotropic liquid crystal polymer film to desired ones. An example of the heating condition will be hereafter explained. Even if the melting point of the obtained thermotropic liquid crystal polymer film is 283° C., the film can be further heated at 260° C. for 5 hours to achieve a melting point of 320° C.

The thermotropic liquid crystal polymer film to be used in the present invention is obtained by extrusion-molding the aforementioned polymer. At that time, any extrusion molding method can be used. However, the T-die film-forming and stretching method, the laminate stretching method, the inflation method, and others well known in the art are industrially advantageous. Particularly with the inflation method, stresses can be applied not only in a direction of the mechanical axis (longitudinal direction) of the film (which direction is hereinafter referred to as the MD direction), but also in a direction (hereinafter referred to as the TD direction) perpendicular to the MD direction and, therefore, the inflation method is effective to eventually manufacture the thermotropic liquid crystal polymer film having balanced physical and thermal properties in both of the MD and TD directions.

The aforesaid thermotropic liquid crystal polymer film must have a segment orientation ratio (SOR) within the range not smaller than 0.90 and smaller than 1.15 in the longitudinal direction of the film. The thermotropic liquid crystal polymer film within this range has balanced physical and thermal properties in the aforesaid MD and TD directions, so that it not only has a high practicability but also advantageously provides good isotropy and dimensional stability of the metal laminate for a circuit board as described above.

The aforesaid segment orientation ratio SOR can be calculated in the following manner.

Using a commercially available microwave molecular orientation degree measuring apparatus, a thermotropic liquid crystal polymer film is inserted into a microwave resonance waveguide so that the film surface thereof is perpendicular to the propagation direction of the microwave, and the intensity (the microwave penetration strength) of an electric field of the microwave transmitted through the thermotropic liquid crystal polymer film is measured.

Based on the resultant measurement, an m value (hereinafter referred to as an "index of refraction") can be calculated from the following equation:

$$m=(Z_0/\Delta z)\times(1-v_{max}/v_0)$$

wherein $Z_o$ represents a device constant, $\Delta z$ represents an average thickness of an object subjected to the measurement, $v_{max}$ represents the frequency at which the maximum microwave penetration strength can be obtained when the frequency of the microwave is changed, and $v_o$ represents the frequency at which the maximum microwave penetration strength can be obtained when the average thickness is zero, that is, when no object is present.

The segment orientation ratio (SOR) can be calculated from the following equation:

$$SOR=m_o/m_{90}$$

wherein $m_0$ represents a value of the m value which is exhibited when the angle of rotation of the object relative to the direction of oscillation of the microwave is 0°, that is, when the direction of oscillation of the microwave is aligned with the direction in which molecules of the object are most oriented (generally the longitudinal direction of the extrusion-molded film) and in which the minimum microwave penetration strength is exhibited, and $m_{90}$ represents a value of the m value which is exhibited when the angle of rotation of the object is 90°.

If the segment orientation ratio SOR is not greater than 0.50 or not smaller than 1.50, the deviation of the orientation of the liquid crystal polymer molecules is considerable, so that the film will be hard and is likely to be torn in the TD direction or in the MD direction. For use in a circuit board requiring a morphological stability such as absence of warping in heating, it is necessary that the segment orientation ratio SOR is within the range not smaller than 0.90 and smaller than 1.15. Particularly, if the warping at the time of heating must be almost completely eliminated, the segment orientation ratio SOR is preferably not smaller than 0.95 and not greater than 1.08.

The thermotropic liquid crystal polymer film to be used in the present invention may have an arbitrary thickness, and includes plate-like or sheet-like films having a thickness not greater than 2 mm. However, if a metal laminate using a thermotropic liquid crystal polymer film as an electrically insulating material is to be used as a printed wiring board, the thickness of the film is preferably within the range from 20 to 150 µm, more preferably within the range from 20 to 50 µm. If the thickness of the film is too small, the rigidity and the strength of the film will be small, so that the film is deformed in mounting electronic components on the obtained printed wiring board, thereby deteriorating the position precision of the wiring to cause a failure of the circuit. Also, as an electrically insulating material for a main circuit board, for example, of a personal computer or the like, it is possible to use a composite of the aforesaid thermotropic liquid crystal polymer film with another electrically insulating material such as glass cloth base material. Further, additives such as a lubricant and an antioxidant may be blended with the film.

Further, in the present invention, in the first step, a long metal sheet is superposed on at least one surface of a long thermotropic liquid crystal polymer film, and these are press-bonded between hot rolls for forming a laminate. The hot rolls may be, for example, a pair of a heat-resistant rubber roll and a hot metal roll in the case of a single-sided metal laminate. The heat-resistant rubber roll and the metal roll are preferably positioned in such a manner that the heat-resistant rubber roll is positioned at the film side, and the metal roll is positioned on the metal sheet side. In the case of a double-sided metal laminate, a pair of hot metal rolls are used. By transporting the thermotropic liquid crystal polymer film and the metal sheet in a superposed state in the longitudinal direction of the film, they are supplied between the rolls to thermally press-bond the film to the metal sheet for forming a laminate. In a subsequent second step, the metal laminate is heated to a temperature not lower than the melting point of the thermotropic liquid crystal polymer film to form a metal laminate for a circuit board.

The heat-resistant rubber rolls used in the case of the aforesaid single-side metal laminate preferably have a hardness of the roll surface of 80 degrees or more, more preferably within the range from 80 to 95 degrees, as tested by an A-type spring hardness tester based on JIS K6301. The rubber of 80 degrees or more is obtained by adding a vulcanization accelerator such as a vulcanizer or an alkaline substance into a synthetic such as a silicone rubber or a fluororubber, or natural rubber. At this time, if the hardness is smaller than 80 degrees, the pressure insufficiency is invited at the time of thermal press-bonding, thereby causing insufficient adhesion strength of the laminate. On the other hand, if the hardness exceeds 95 degrees, a local line pressure is applied between the hot metal roll and the heat-resistant rubber roll, raising a fear that the appearance of the laminate will be poor.

As described above, after the thermotropic liquid crystal polymer film and the metal sheet are thermally press-bonded, the obtained laminate is heated to a temperature not lower than the melting point of the thermotropic liquid crystal polymer film in the second step, thereby to form the metal laminate. Here, since the thermal expansion coefficient of the thermotropic liquid crystal polymer film changes at the time of thermal press-bonding with the metal sheet and at the time of heating the laminate, a process must be designed taking this change into consideration in advance. As an example thereof, in the thermal press-bonding with the metal sheet in the first step, the tension applied to the thermotropic liquid crystal polymer film is preferably adjusted to be within the range from 1.2 to 2.8 kg/mm². Further, in the second step, if the laminate is to be heated successively to the first step, the tension applied to the laminate is preferably adjusted to be within the range from 2.5 kg to 5.5 kg for a width of 40 cm. Further, the means for heating the laminate in the second step is not specifically limited, and may be, for example, a hot air circulating dryer, a hot air heating furnace, a hot roll, a ceramic heater, or the like. For the purpose of preventing oxidation of the surface of the metal sheet, it is preferable to heat the laminate in an inert atmosphere having an oxygen concentration of 0.1% or less by using heated nitrogen gas.

The above-mentioned heating process is preferably performed at a temperature within the range from the melting point of the thermotropic liquid crystal polymer film to the temperature higher by 30° C. than the melting point. If the heating temperature is lower than the melting point, the effect of improving the dimensional stability is inferior, and moreover, the adhesion strength with the metal sheet is low. On the other hand, if the heating temperature exceeds the temperature higher by 30° C. than the melting point, it comes near to the decomposition temperature of the thermotropic liquid crystal polymer film, thereby disadvantageously causing deterioration of the appearance such as coloring.

The metal foil to be used in the present invention is not specifically limited, but is suitably a metal such as used for establishing electrical connection. For example, gold, silver, nickel, aluminum, and other metals may be mentioned in addition to copper. A copper foil may be any of those produced by calendering, electrolysis, and the like. However, those having a large surface roughness produced by electrolysis are preferable because their adhesion strength with the thermotropic liquid crystal polymer film is high. The metal foil may be subjected beforehand to a chemical treatment such as acid washing, which is generally performed on copper foils. The thickness of the metal foil is preferably within the range from 9 to 200 µm, more preferably within the range from 9 to 40 µm.

Further, in the present invention, a metal plate having a thickness within the range from 0.2 to 2 mm can be used instead of the metal foil. In particular, in the case where the laminate of the present invention is to be used as a heat-dissipating plate for electronic components, the thickness of the metal plate is preferably within the range from 0.2 to 1 mm in view of the bending processability. The metal plate having such a thickness is generally produced by calendering, and is flat with its surface roughness being not greater than 1 µm, so that it is preferable to use the metal plate after chemically or physically making the surface roughness to be 2 to 4 µm. By doing so, the adhesion strength between the metal plate and the thermotropic liquid crystal polymer film will be high. Further, the surface roughness is not particularly limited, but it is preferable to avoid a roughness of 50% or more of the thickness of the metal plate, because the strength of the metal plate will then be fragile. Further, it is preferable to avoid the surface roughness of 50% or more of the thickness of the thermotropic liquid crystal polymer film, because the strength of the thermotropic liquid crystal polymer film will then be fragile.

BRIEF DESCRIPTION OF THE DRAWINGS

In any event, the present invention will be more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

DETAILED DESCRIPTION OF EMBODIMENTS OF THE INVENTION

Hereafter, embodiments of the present invention will be described with reference to the attached drawing.

Figure 1:
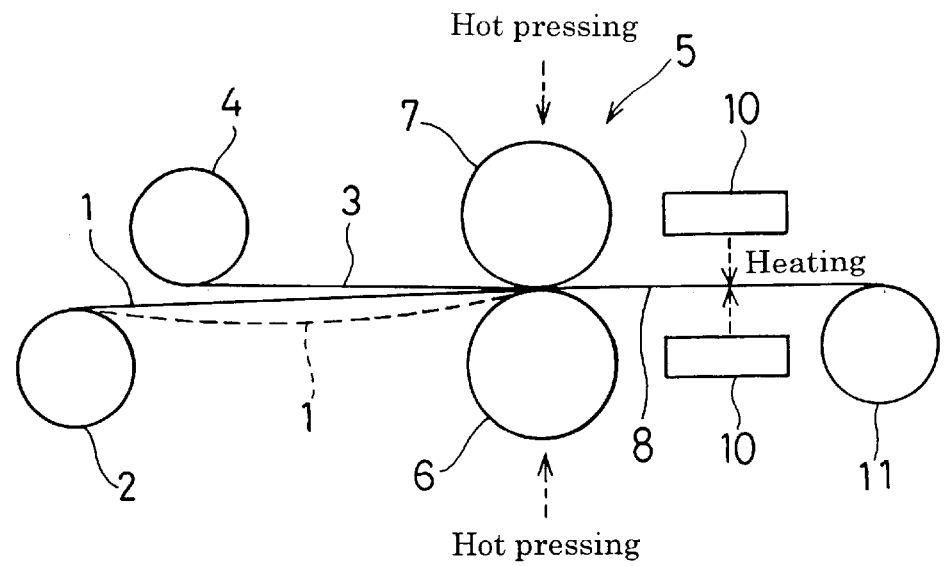
FIG. 1 is a view illustrating a construction of an apparatus to be used in a method of producing a single-sided metal laminate for a circuit board according to the first embodiment of the present invention.

FIG. 1 illustrates a continuous hot roll press apparatus to be used in a method of producing a metal laminate for a circuit board according to the first embodiment of the present invention. In the present apparatus, a single-sided metal laminate having a metal sheet 3 bonded to one surface of a thermotropic liquid crystal polymer film 1 is produced. The present apparatus includes an unwinding roll 2 having a thermotropic liquid crystal polymer film 1 mounted thereon in a roll form, an unwinding roll 4 having a metal sheet 3 such as a copper foil mounted thereon in a roll form, hot rolls 5 for thermally press-bonding the film 1 onto the metal sheet 3, a heating means 10 such as a hot air heating furnace for heating the obtained laminate to a temperature not lower than the melting point of the thermotropic liquid crystal polymer film 1, and a winding roll 11 for winding up the heated single-sided metal laminate 8. The hot rolls 5 include a heat-resistant rubber roll 6 having a roll surface hardness of 80 degrees or more, and a hot metal roll 7.

In the first production method for producing the single-sided metal laminate 8, the thermotropic liquid crystal polymer film 1 is press-bonded in a tense state (solid line) in the first step using the above-mentioned apparatus. Namely, the thermotropic liquid crystal polymer film 1 having a segment orientation ratio SOR within the range not smaller than 1.03 and smaller than 1.15 in the longitudinal direction of the film and the metal sheet 3 are sandwiched between the heat-resistant rubber roll 6 and the hot metal roll 7 as above-mentioned to thermally press-bond the thermotropic liquid crystal polymer film 1 in a tense state (solid line). The tension of the film 1 is measured by a tensiometer (not illustrated) and is controlled to a predetermined tension (for example, 1.2 to 2.8 kg/mm$^2$), for example, by changing the relative rotation speed between the unwinding roll 2 and the hot rolls 5 with a controlling device (not illustrated). In the second step subsequent to the first step, the laminate obtained in the first step is heated to a temperature not lower than the melting point of the thermotropic liquid crystal polymer film 1 by the heating means 10 to continuously produce the single-sided metal laminate 8. In the second step, the tension of the single-sided metal laminate 8 is also controlled to be a predetermined value (for example, 2.5 to 5.5 kg/40 cm width).

Further, in the second production method for producing the single-sided metal laminate 8, the thermotropic liquid crystal polymer film 1 is press-bonded in a non-tense state (broken line) in the first step using the above-mentioned apparatus. Namely, the thermotropic liquid crystal polymer film 1 having a segment orientation ratio SOR within the range not smaller than 0.90 and smaller than 1.03 in the longitudinal direction of the film and the metal sheet 3 are sandwiched between the heat-resistant rubber roll 6 and the hot metal roll 7 as above-mentioned to thermally press-bond the thermotropic liquid crystal polymer film 1 in a non-tense state (broken line) that loosens the thermotropic liquid crystal polymer film 1 a little. The film 1 is kept in a non-tense state, for example, by changing the relative rotation speed between the unwinding roll 2 and the hot rolls 5 in the same manner as described above. The other processes are the same as in the first production method. Here, in the second step, the tension to the single-sided metal laminate 8 is likewise controlled to be a predetermined value (for example, 2.5 to 5.5 kg/40 cm width) because it is formed on the laminate as in the first production method.

Figure 2:
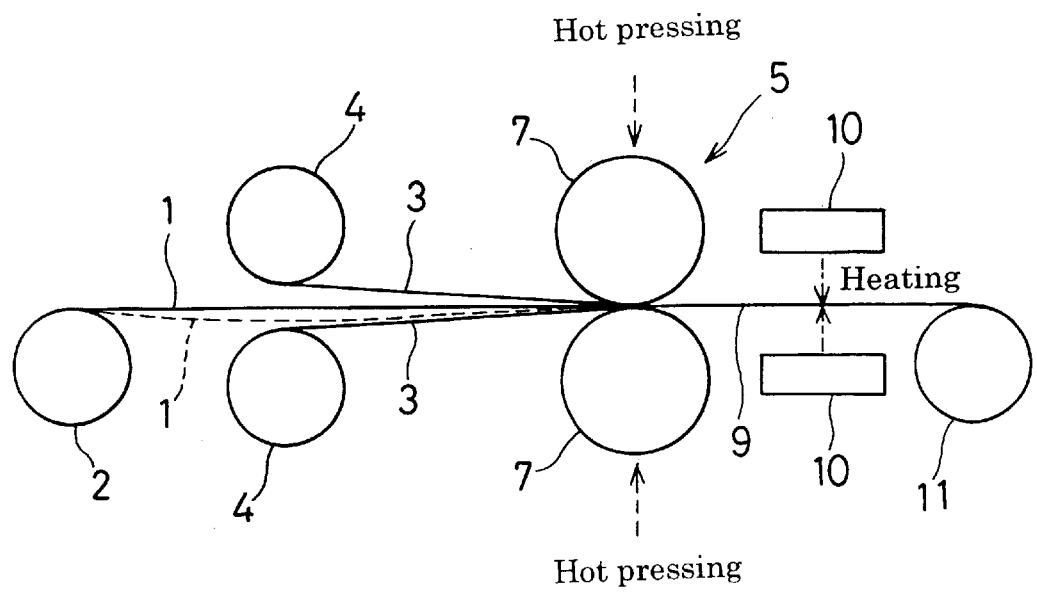
FIG. 2 is a view illustrating a construction of an apparatus to be used in a method of producing a double-sided metal laminate for a circuit board according to the second embodiment of the present invention.

FIG. 2 illustrates a continuous hot roll press apparatus to be used in a method of producing a metal laminate for a circuit board according to the second embodiment of the present invention. In the present apparatus, a double-sided metal laminate having a metal sheet 3 bonded to both surfaces of a thermotropic liquid crystal polymer film 1 is produced. The present apparatus includes an unwinding roll 2 having a thermotropic liquid crystal polymer film 1 mounted thereon in a roll form, unwinding rolls 4, 4 having a metal sheet 3 such as a copper foil mounted thereon in a roll form, hot rolls 5 for thermally press-bonding the metal sheet 3 onto both surfaces of the film 1, a heating means 10 for heating the obtained laminate to a temperature not lower than the melting point of the thermotropic liquid crystal polymer film 1, and a winding roll 11 for winding up the heated double-sided metal laminate 9. The hot rolls 5 include a pair of hot metal rolls 7, 7.

In the first production method for producing the double-sided metal laminate 9, the thermotropic liquid crystal polymer film 1 is press-bonded in a tense state (solid line) in the first step using the above-mentioned apparatus. Namely, the thermotropic liquid crystal polymer film 1 having a segment orientation ratio SOR within the range not smaller than 1.03 and smaller than 1.15 in the longitudinal direction of the film and the metal sheet 3 are sandwiched between the above-mentioned pair of hot metal rolls 7, 7 to thermally press-bond the thermotropic liquid crystal polymer film 1 in a tense state (solid line). In the second step subsequent to the first step, the laminate obtained in the first step is heated to a temperature not lower than the melting point of the thermotropic liquid crystal polymer film 1 to continuously produce the double-sided metal laminate 9 in the same manner as described above.

Further, in the second production method for producing the double-sided metal laminate 9, the thermotropic liquid crystal polymer film 1 is press-bonded in a non-tense state (broken line) in the first step using the above-mentioned apparatus. Namely, the thermotropic liquid crystal polymer film 1 having a segment orientation ratio SOR within the range not smaller than 0.90 and smaller than 1.03 in the longitudinal direction of the film and the metal sheet 3 are sandwiched between the above-mentioned pair of hot metal rolls 7, 7 to thermally press-bond the thermotropic liquid crystal polymer film 1 in a non-tense state (broken line). The other processes are the same as in the first production method.

EXAMPLES

Hereinafter, the present invention will be described in detail with reference to the Examples. However, the present invention is in no way limited by these Examples. Here, in the following Reference Examples and Examples, the melting point, the adhesion strength, and the dimensional stability of a thermotropic liquid crystal polymer film were measured by the following methods.

(1) Melting Point

Using a differential scanning calorimeter, the thermal behavior of the film was observed for measurement of the melting point. In other words, after the temperature of the test film was raised at a rate of 20° C./min to completely melt the film, the molten product was rapidly cooled to 50° C. at a rate of 50° C./min and then the position of the heat absorption peak appearing when the temperature thereof was raised again at a rate of 20° C./min was recorded as the melting point of the film.

(2) Adhesion Strength

A peeling test piece having a width of 1.5 cm was prepared from a laminate, and its film layer was fixed to a flat plate by means of a double-sided adhering tape. In accordance with JIS C5016, the adhesion strength (kg/cm) when the metal foil was peeled off at a rate of 50 mm/min by the 180° method was measured.

(3) Dimensional Stability

The dimensional stability was measured according to the IPC-TM-6502.2.4.

REFERENCE EXAMPLE

A thermotropic liquid crystal polymer composed of a copolymer of p-hydroxybenzoic acid and 6-hydroxy-2-naphthoic acid and having a melting point of 280° C. was melt-extruded to produce various liquid crystal polymer films having a thickness of 50 μm and different segment orientation ratios (SOR) by the inflation molding method.

The film having a segment orientation ratio SOR of 1.05 is referred to as A-type; the film of 1.03 as B-type; the film of 1.50 as C-type; the film of 1.00 as D-type; the film of 0.95 as E-type; the film of 0.99 as F-type; the film of 0.80 as G-type; and the film of 1.15 as H-type.

Example 1

The thermotropic liquid crystal polymer film of A-type obtained in the Reference Example (SOR: 1.05) and an electrolytic copper foil having a thickness of 18 μm were used. A heat-resistant rubber roll (hardness: 90 degrees) and a hot metal roll were mounted to a continuous hot roll press apparatus, and the thermotropic liquid crystal polymer film and the electrolytic copper foil were supplied between the rolls so that the thermotropic liquid crystal polymer film was in contact with the heat-resistant rubber roll surface and the electrolytic copper foil was in contact with the hot metal roll surface, and press-bonded in a heated state of 260° C. and at a pressure of 10 kg/cm$^2$ to produce a laminate having a construction of thermotropic liquid crystal polymer film/ electrolytic copper foil. At that time, a tension of 3 kg/40 cm width was applied to the thermotropic liquid crystal polymer film 1. Subsequently, the laminate was suspended in a hot air circulating dryer controlled to be 300° C. and heated for 5 minutes to produce a single-sided copper laminate. The obtained copper laminate was subjected to tests on adhesion strength and dimensional stability. The results are shown in Table 6.

Example 2

The thermotropic liquid crystal polymer film of A-type (SOR: 1.05) obtained in the Reference Example and an electrolytic copper foil having a thickness of 18 μm were used. A heat-resistant rubber roll 6 (hardness: 90 degrees) and a hot metal roll 7 were mounted to a continuous hot roll press apparatus of FIG. 1, and the thermotropic liquid crystal polymer film 1 and the electrolytic copper foil 3 were supplied between the rolls 6, 7 so that the thermotropic liquid crystal polymer film 1 was in contact with the heat-resistant rubber roll 6 surface and the electrolytic copper foil 3 was in contact with the hot metal roll 7 surface, and press-bonded in a heated state of 260° C. and at a pressure of 10 kg/cm$^2$ to produce a laminate having a construction of thermotropic liquid crystal polymer film/ electrolytic copper foil. Subsequently, the laminate was heated at 300° C. for 10 seconds in a hot air type heating furnace 10 to continuously produce a single-sided copper laminate 8. At the time of the thermal press-bonding in the first step, a tension (solid line) of 3 kg/40 cm width was applied to the thermotropic liquid crystal polymer film 1. At the time of the heating process in the second step, the same tension of 3 kg/40 cm width was applied to the single-sided copper laminate 8. The obtained copper laminate was subjected to tests on adhesion strength and dimensional stability. The results are shown in Table 6.

Example 3

By using the thermotropic liquid crystal polymer film of B-type (SOR: 1.03) obtained in the Reference Example and an electrolytic copper foil having a thickness of 18 μm, a single-sided copper laminate was produced in the same manner as in Example 2. However, at the time of the thermal press-bonding in the first step, a tension of 5 kg/40 cm width was applied to the thermotropic liquid crystal polymer film; and at the time of the heating process in the second step, the same tension of 5 kg/40 cm width was applied to the single-sided copper laminate. The obtained copper laminate was subjected to tests on adhesion strength and dimensional stability. The results are shown in Table 6.

Comparative Example 1

By using the thermotropic liquid crystal polymer film of C-type (SOR: 1.50) obtained in the Reference Example and an electrolytic copper foil having a thickness of 18 μm, a single-sided copper laminate was produced in the same manner as in Example 2. The obtained copper laminate was subjected to tests on adhesion strength and dimensional stability. The results are shown in Table 6.

Comparative Example 2

The thermotropic liquid crystal polymer film of C-type (SOR: 1.50) obtained in the Reference Example and an electrolytic copper foil having a thickness of 18 μm were used, and a single-sided copper laminate was produced in the same manner as in Example 2 except that the temperature and the period of time for heating in the second step were set to be 260° C. and 10 seconds, respectively. The obtained copper laminate was subjected to tests on adhesion strength and dimensional stability. The results are shown in Table 6.

Comparative Example 3

By using the thermotropic liquid crystal polymer film of D-type (SOR: 1.00) obtained in the Reference Example and an electrolytic copper foil having a thickness of 18 μm, a single-sided copper laminate was produced in the same manner as in Example 2. The obtained copper laminate was subjected to tests on adhesion strength and dimensional stability. The results are shown in Table 6.

TABLE 6

| | SOR of thermotropic liquid crystal polymer film | Adhesion strength (kg/cm) | Dimensional stability (%) | |
|---|---|---|---|---|
| | | | MD direction | TD direction |
| Example 1 | 1.05 | 1.2 | −0.01 | +0.01 |
| Example 2 | 1.05 | 1.3 | +0.05 | −0.02 |
| Example 3 | 1.03 | 1.5 | −0.02 | +0.01 |
| Comparative Example 1 | 1.50 | 1.2 | +0.10 | −0.05 |
| Comparative Example 2 | 1.50 | 0.7 | +0.25 | −0.20 |
| Comparative Example 3 | 1.00 | 1.3 | −0.20 | +0.30 |

As will be apparent from the above Table 6, the single-sided copper laminate obtained in Comparative Example 1 had a poor dimensional stability due to large anisotropy though it had a sufficient adhesion strength. The single-sided copper laminate obtained in Comparative Example 2 had a low adhesion strength and a poor dimensional stability due to large anisotropy. The single-sided copper laminate obtained in Comparative Example 3 had a poor dimensional stability due to large anisotropy though it had a sufficient adhesion strength. In contrast to these, the single-sided copper laminates obtained in Examples 1 to 3 according to the present invention had both a good adhesion strength and a good dimensional stability. Also, since good results are obtained by continuously performing the thermal press-bonding and the heating process as in Examples 2 and 3, the productivity of the single-sided copper laminate can be heightened by the continuous production.

Example 4

The thermotropic liquid crystal polymer film 1 of E-type (SOR: 0.95) obtained in the Reference Example and an electrolytic copper foil having a thickness of 18 μm were used. A heat-resistant rubber roll 6 (hardness: 90 degrees) and a hot metal roll 7 were mounted to a continuous hot roll press apparatus of FIG. 1, and the thermotropic liquid crystal polymer film 1 and the electrolytic copper foil 3 were supplied between the rolls 6, 7 so that the thermotropic liquid crystal polymer film 1 was in contact with the heat-resistant rubber roll 6 surface and the electrolytic copper foil 3 was in contact with the hot metal roll 7 surface, and press-bonded in a heated state of 280° C. and at a pressure of 20 kg/cm² to produce a laminate having a construction of thermotropic liquid crystal polymer film/ electrolytic copper foil. Subsequently, the laminate was heated at 300° C. for 10 seconds in a hot air type heating furnace 10 to continuously produce a single-sided copper laminate 8. At the time of the thermal press-bonding in the first step, the thermotropic liquid crystal polymer film 1 was loosened a little to be brought into a non-tense state (broken line). At the time of the heating process in the second step, a tension of 3 kg/40 cm width was applied to the single-sided copper laminate 8. The obtained copper laminate was subjected to tests on adhesion strength and dimensional stability. The results are shown in Table 7.

Example 5

The thermotropic liquid crystal polymer film of F-type (SOR: 0.99) obtained in the Reference Example and an electrolytic copper foil having a thickness of 18 μm were used. A pair of hot metal rolls 7, 7 were mounted to a continuous hot roll press apparatus of FIG. 2, and the thermotropic liquid crystal polymer film 1 and the electrolytic copper foil 3 were supplied between the rolls 7, 7 so that the thermotropic liquid crystal polymer film 1 would be sandwiched between two sheets of the electrolytic copper foils 3, and press-bonded in a heated state of 280° C. and at a pressure of 20 kg/cm² to produce a laminate having a construction of electrolytic copper foil/thermotropic liquid crystal polymer film/electrolytic copper foil. Subsequently, the laminate was heated at 300° C. for 10 seconds in a hot air type heating furnace 10 to continuously produce a double-sided copper laminate 9. At the time of the thermal press-bonding in the first step, the thermotropic liquid crystal polymer film 1 was loosened a little to be brought into a non-tense state (broken line). At the time of the heating process in the second step, a tension of 3 kg/40 cm width was applied to the double-sided copper laminate 9. The obtained copper laminate was subjected to tests on adhesion strength and dimensional stability. The results are shown in Table 7.

Comparative Example 4

A single-sided copper laminate having a construction of thermotropic liquid crystal polymer film/electrolytic copper foil was produced in the same manner as in Example 4 except that the thermotropic liquid crystal polymer film of G-type (SOR: 0.80) obtained in the Reference Example was used. The obtained copper laminate was subjected to tests on adhesion strength and dimensional stability. The results are shown in Table 7.

Comparative Example 5

The thermotropic liquid crystal polymer film of H-type (SOR: 1.15) obtained in the Reference Example and an electrolytic copper foil having a thickness of 18 μm were used. A heat-resistant rubber roll 6 (hardness: 90 degrees) and a hot metal roll 7 were mounted to a continuous hot roll press apparatus of FIG. 1, and the thermotropic liquid crystal polymer film 1 and the electrolytic copper foil 3 were supplied between the rolls 6, 7 so that the thermotropic liquid crystal polymer film 1 was in contact with the heat-resistant rubber roll 6 surface and the electrolytic copper foil 3 was in contact with the hot metal roll 7 surface, and press-bonded in a heated state of 280° C. and at a pressure of 20 kg/cm² to produce a laminate having a construction of thermotropic liquid crystal polymer film/ electrolytic copper foil. Subsequently, the laminate was heated at 300° C. for 10 seconds in a hot air type heating furnace 10 to continuously produce a single-sided copper laminate 8. At the time of the thermal press-bonding in the first step, a tension (solid line) of 10 kg/40 cm width was applied to the thermotropic liquid crystal polymer film 1. At the time of the heating process in the second step, a tension of 3 kg/40 cm width was applied to the single-sided copper laminate 8. The obtained copper laminate was subjected to tests on adhesion strength and dimensional stability. The results are shown in Table 7.

TABLE 7

|  | SOR of thermotropic liquid crystal polymer film | Adhesion strength (kg/cm) | Dimensional stability (%) | |
| --- | --- | --- | --- | --- |
|  |  |  | MD direction | TD direction |
| Example 4 | 0.95 | 1.2 | −0.01 | +0.01 |
| Example 5 | 0.99 | 1.3 | +0.01 | +0.01 |
| Comparative Example 4 | 0.80 | 1.0 | −0.20 | +0.25 |
| Comparative Example 5 | 1.15 | 1.0 | +0.35 | −0.10 |

As will be apparent from the above Table 7, the single-sided copper laminate obtained in Comparative Example 4 had an insufficient adhesion strength and a poor dimensional stability due to large anisotropy. The single-sided copper laminate obtained in Comparative Example 5 had an insufficient adhesion strength and a poor dimensional stability due to large anisotropy. In contrast to these, the copper laminates obtained in Examples 4 and 5 according to the present invention had both a good adhesion strength and a good dimensional stability. Also, since good results are obtained by continuously performing the thermal press-bonding and the heating process as in Examples 4 and 5, the productivity of the single-sided and double-sided copper laminates can be heightened by the continuous production.

Although the present invention has been fully described in connection with the preferred embodiments thereof with reference to the accompanying drawings which are used only for the purpose of illustration, those skilled in the art will readily conceive of numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

What is claimed is:

1. A method of producing a metal laminate for a circuit board, the method comprising press-bonding between hot rolls a thermotropic liquid crystal polymer film in a tense state to a metal sheet at a temperature not higher than the melting point of the film to form a first laminate, where the film is capable of forming an optically anisotropic melt phase and the film has a segment orientation ratio SOR within a range not smaller than 1.03 and smaller than 1.15 along a longitudinal direction of the film; and, after the press-bonding, heating the first laminate to a temperature not lower than the melting point of the film.

2. A method of producing a metal laminate for a circuit board, the method comprising press-bonding between hot rolls a thermotropic liquid crystal polymer film in a non-tense state to a metal sheet at a temperature not higher than the melting point of the film to form a first laminate, where
the film is capable of forming an optically anisotropic melt phase and
the film has a segment orientation ratio SOR within a range not smaller than 0.90 and smaller than 1.03 along a longitudinal direction of the film; and, after the press-bonding, heating the first laminate to a temperature not lower than the melting point of the thermotropic liquid crystal polymer film.

3. The method as claimed in claim 1, wherein the metal laminate is a single-sided metal laminate having the metal sheet bonded to one surface of the film.

4. The method as claimed in claim 2, wherein the metal laminate is a single-sided metal laminate having the metal sheet bonded to one surface of the film.

5. The method as claimed in claim 1, wherein the metal laminate is a double-sided metal laminate having the metal sheet bonded to one surface of the film and another metal sheet bonded to another surface of the film.

6. The method as claimed in claim 2, wherein the metal laminate is a double-sided metal laminate having the metal sheet bonded to one surface of the film and another metal sheet bonded to another surface of the film.

7. The method as claimed in claim 3, wherein the film is press-bonded to the metal sheet between a hot metal roll and a heat-resistant rubber roll whose roll surface has a hardness not smaller than 80 degrees.

8. The method as claimed in claim 4, wherein the film is press-bonded to the metal sheet between a hot metal roll and a heat-resistant rubber roll whose roll surface has a hardness not smaller than 80 degrees.

9. A metal laminate for a circuit board, obtained by the method as claimed in claim 1.

10. A metal laminate for a circuit board, obtained by the method as claimed in claim 2.

11. The method as claimed in claim 1, wherein the film comprises at least one thermotropic liquid crystal polymer selected from the group consisting of a thermotropic liquid crystal polyester and a thermotropic liquid crystal polyester amide.

12. The method as claimed in claim 2, wherein the film comprises at least one thermotropic liquid crystal polymer selected from the group consisting of a thermotropic liquid crystal polyester and a thermotropic liquid crystal polyester amide.

13. The method as claimed in claim 11, wherein the at least one thermotropic liquid crystal polymer is prepared at least one of the following compounds and their derivatives:

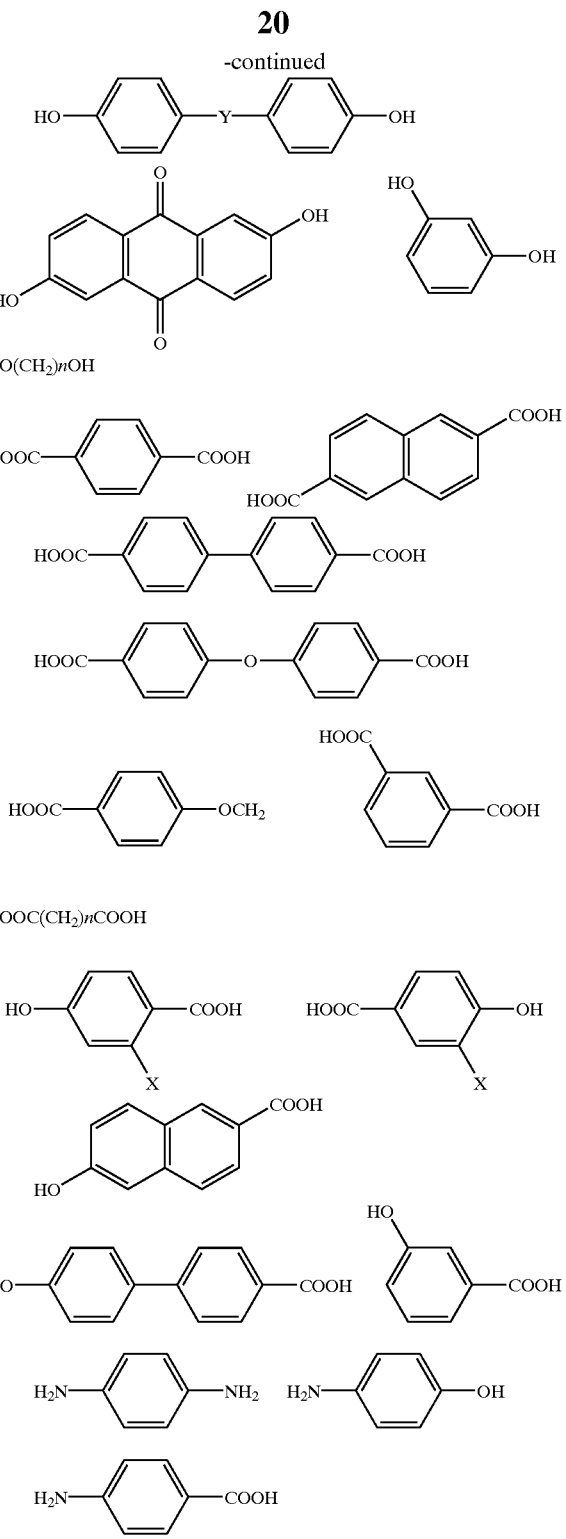

where X: hydrogen atom, halogen atom, lower alkyl, or phenyl;

Y: O, $CH_2$, or S; and n: an integer from 2 to 12.

14. The method as claimed in claim 12, wherein the at least one thermotropic liquid crystal polymer is prepared from at least one of the following compounds and their derivatives:

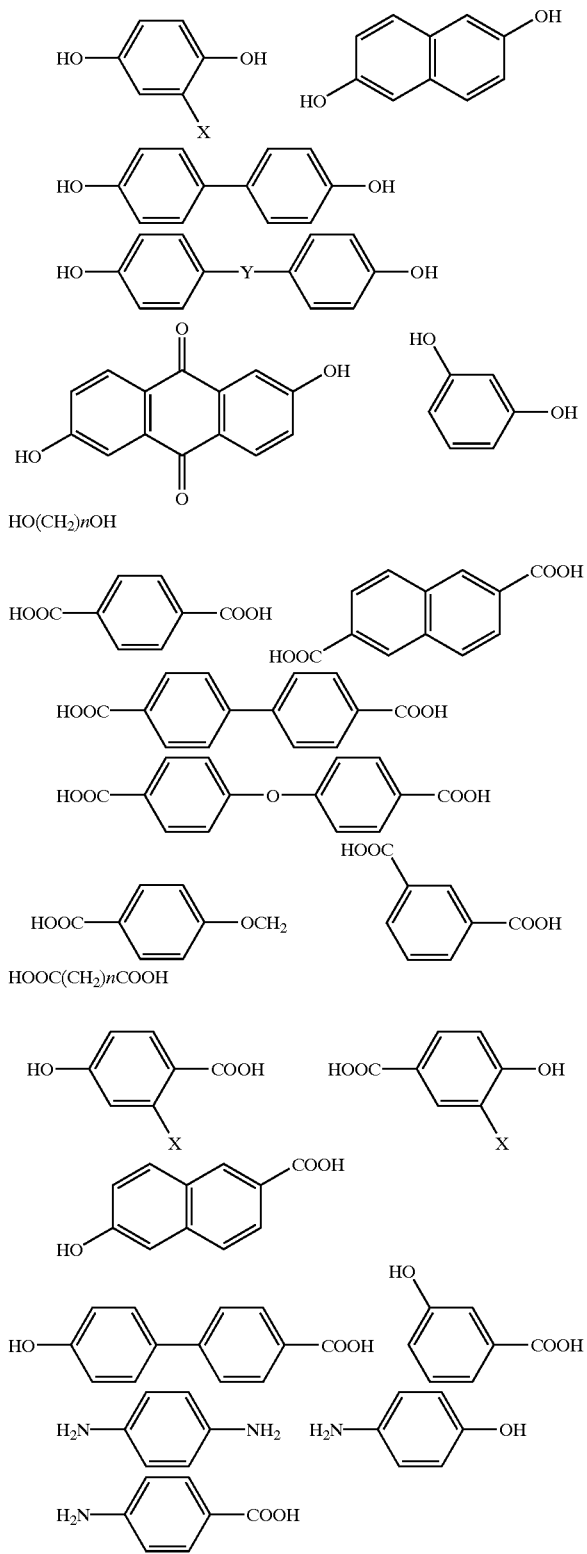

where X: hydrogen atom, halogen atom, lower alkyl, or phenyl;

Y: O, CH$_2$, or S; and n: an integer from 2 to 12.

15. The method as claimed in claim 1, wherein the thermotropic liquid crystal polymer is at least one selected from the group consisting of the following copolymers (a) to (e):

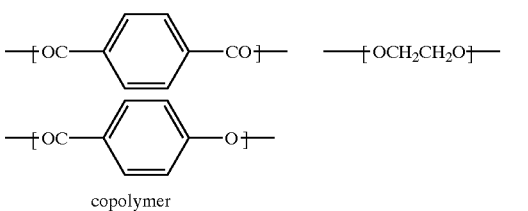

copolymer (a)

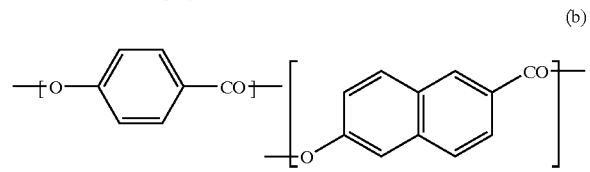

copolymer (b)

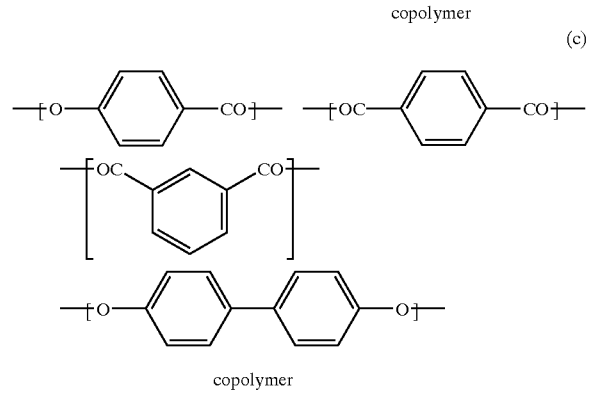

copolymer (c)

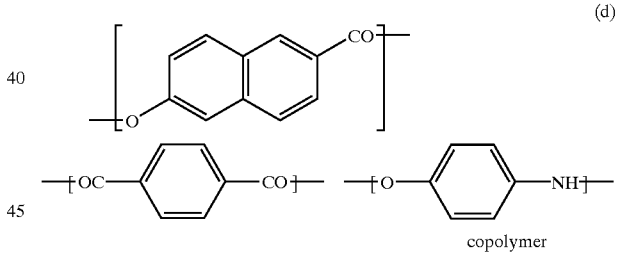

copolymer (d)

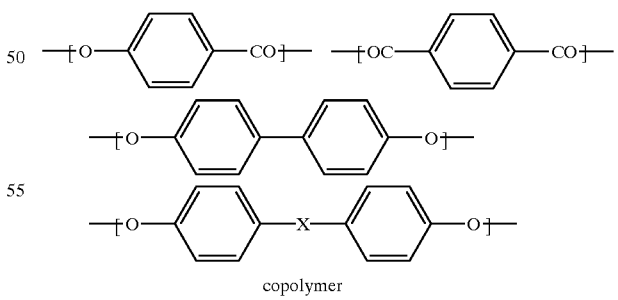

copolymer (e)

where X: O, CH$_2$ or S.

16. The method as claimed in claim 2, wherein the thermotropic liquid crystal polymer is at least one selected from the group consisting of the following copolymers (a) to (e):

(a)
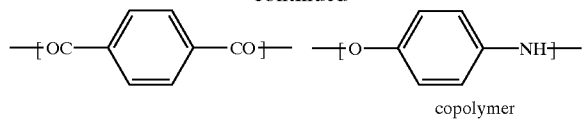
(b)
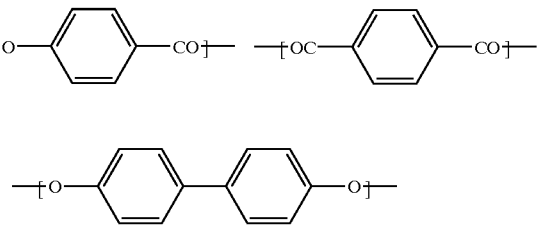
(e)
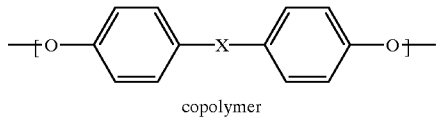
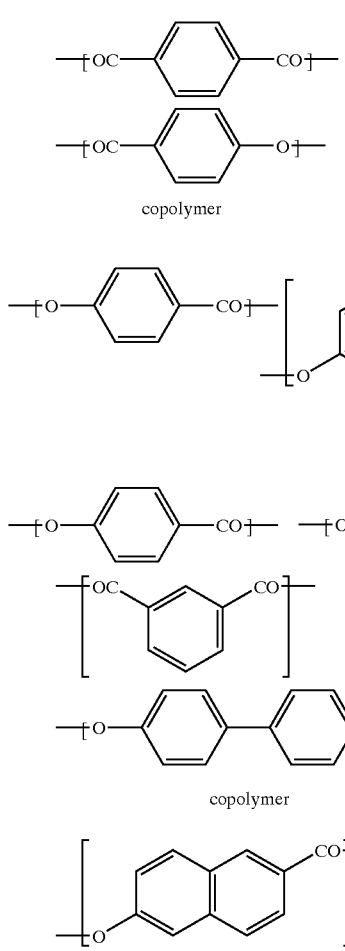
where X: O, CH$_2$ or S.
17. The method as claimed in claim 1, further comprising, before the press-bonding, supplying a roll of the thermotropic liquid crystal polymer film.
18. The method as claimed in claim 2, further comprising, before the press-bonding, supplying a roll of the thermotropic liquid crystal polymer film.
* * * * *